United States Patent [19]

Carson

[11] Patent Number: 4,513,447
[45] Date of Patent: Apr. 23, 1985

[54] SIMPLIFIED FREQUENCY SCHEME FOR COHERENT TRANSPONDERS

[75] Inventor: Lansing M. Carson, Temple, Ariz.

[73] Assignee: Motorola, Inc., Schaumburg, Ill.

[21] Appl. No.: 449,344

[22] Filed: Dec. 13, 1982

[51] Int. Cl.³ .......................... H04B 1/40; H04B 1/59
[52] U.S. Cl. ............................................. 455/76; 455/86;
   455/12; 343/6.8 R; 343/7 PL
[58] Field of Search ..................... 455/12, 76, 77, 84,
   455/86, 87; 343/6.8 R, 6.8 LC, 5 TM, 7 PL;
   375/7

[56] References Cited

U.S. PATENT DOCUMENTS

| | | | |
|---|---|---|---|
| 3,594,790 | 7/1971 | Laughlin et al. | 343/6.8 R |
| 3,683,279 | 8/1972 | Weinberg et al. | 455/12 |
| 4,063,173 | 12/1977 | Nelson et al. | 343/7 PL |
| 4,183,022 | 1/1980 | Baudard et al. | 343/7 PL |

*Primary Examiner*—Jin F. Ng
*Attorney, Agent, or Firm*—Eugene A. Parsons

[57] ABSTRACT

A coherent transponder having a transmitter and a receiver operating at different frequencies with each including a numerically controlled oscillator for controlling the frequency thereof through a single-sideband modulator and various outputs from a phase-locked loop the frequencies of the numerically controlled oscillators and the phase-locked loop being referenced to a single crystal controlled oscillator.

9 Claims, 5 Drawing Figures

— PRIOR ART —

SIMPLIFIED FREQUENCY SCHEME FOR COHERENT TRANSPONDERS

BACKGROUND OF THE INVENTION

The present invention pertains to coherent transponders for a communications system and especially to transponders utilized in satellites and the like. Generally, communication with the satellite through a transponder is utilized for determining the relative position of the satellite and may, in addition, be utilized for messages and other information. Basically, the transponder includes a receiver/transmitter carrier tracking loop which must track and demodulate an RF signal transmitted to the satellite carrying the transponder and transmit back to earth a signal which is coherently related by a precise frequency ratio. Traditional methods for accomplishing the tracking and coherent turn-around functions employ analog phase detectors, loop filters, voltage controlled oscillators and an assortment of frequency multipliers for deriving receiver local oscillator signals and the transmitter output. Generally, these analog components require large amounts of space and power. Further, narrow band local oscillator chain elements such as step recovery diode multipliers are costly to align.

In the prior method the receiver LO multiplier chain and the transmitter multiplier chain had to be implemented separately to allow a common multiple (VCXO at 2F1) to act as the coherent reference. This scheme normally requires at least four step recovery diode multipliers and stringent filtering requirements.

SUMMARY OF THE INVENTION

The present invention pertains to a coherent transponder including a transmitter and a receiver operating at a prescribed frequency ratio. A predetermined frequency is derived from a fixed frequency source in the transponder and compared to a controlled operating frequency of the receiver with the comparison being converted to a digital frequency control word which is supplied to a numerically controlled oscillator in the receiver and a numerically controlled oscillator in the transmitter along with predetermined frequency clock pulses derived from the fixed frequency source to control the frequency of the receiver and the transmitter. A phase-locked loop, reference to the fixed frequency source, supplies the high frequency signals required to convert the relatively low operating frequencies of the numerically controlled oscillators into the higher frequencies utilized in the receiver and transmitter.

This invention allows a simplification to a single multiplier chain to be shared by receiver and transmitter and lends itself to a phase locked multiplier approach. The approach completely eliminates the troublesome step recovery diode multipliers and replaces them with digital frequency dividers which are preferred due to stability and ease of alignment. Further advantages include spurious improvements due to elimination of RF switches and a wider achievable tracing range with the NCO implementation.

In one embodiment single-sideband modulators are utilized to mix numerically controlled oscillator signals with phase-locked loop signals to raise the frequency thereof. By referencing the numerically controlled oscillators and the phase-locked loop to a single fixed frequency source the transponder is maintained coherent.

It is an object of the present invention to provide a new and improved coherent transponder by a simplification in the frequency scheme.

It is a further object of the present invention to provide a new and improved coherent transponder utilizing numerically controlled oscillators and digital control which is greatly simplified and reduced in expense and alignment time.

It is a further object of the present invention to provide a coherent transponder utilizing digital frequency control techniques which can be efficiently implemented with microprocessor techniques.

It is a further object of the present invention to provide a new and improved coherent transponder implementing digital techniques whereby sensitive analog components which are difficult to manufacture and operate maybe eliminated.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENTS

Figure 1:
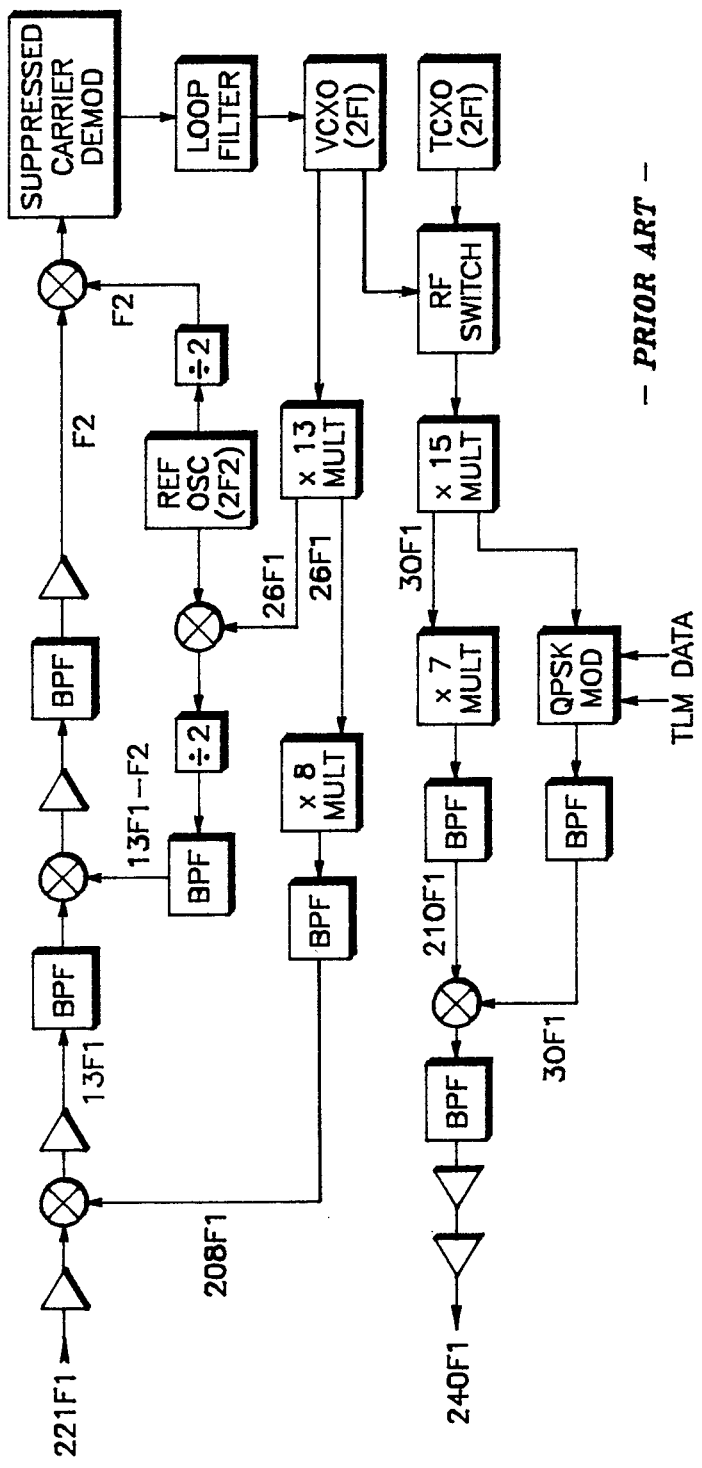
FIG. 1 is a block diagram of a prior art coherent transponder.

FIG. 1 is a block diagram of a prior art coherent transponder utilizing a plurality of frequency multipliers to raise a reference frequency to the required transmission frequency and a second plurality of frequency multipliers to convert the received frequency down to the reference frequency. The frequency multipliers are expensive to manufacture and are difficult and costly to align. Also, the multipliers are a constant source of trouble.

Figure 2:
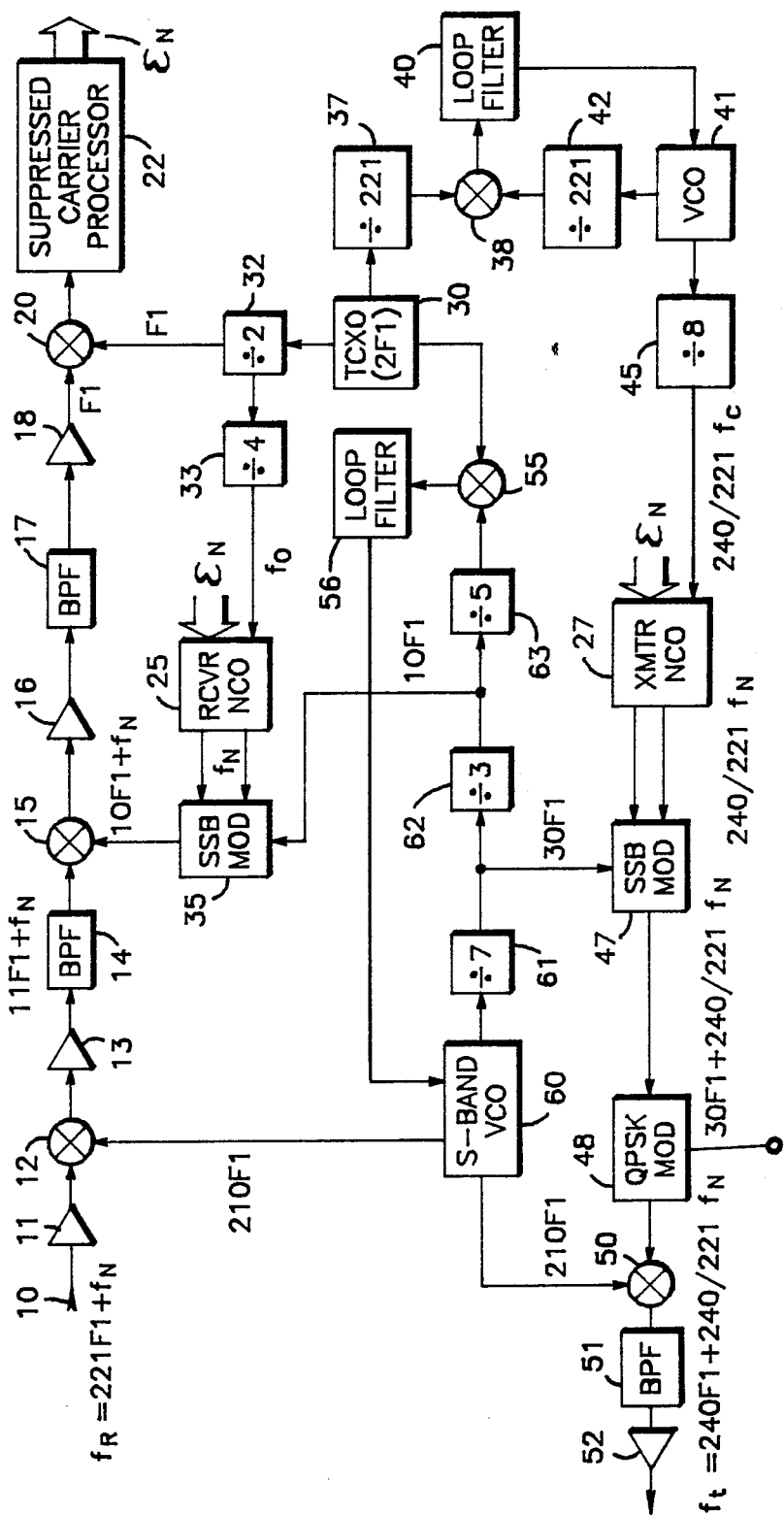
FIG. 2 is a block diagram of a coherent transponder embodying the present invention.

Referring specifically to FIG. 2, a block diagram of a coherent transponder including a receiver and a transmitter operating at different frequencies is illustrated. Received signals from an antenna system (not shown) are supplied to an input terminal 10. The received signals at the input terminal 10 are supplied through an RF amplifier 11 to a first input of a first combining circuit, in this embodiment a mixer 12. The desired combined signal is supplied from the output of the mixer 12 through an amplifier 13 and a bandpass filter 14 to a first input of a second combining circuit, in this embodiment a mixer 15. The desired combined signal is available at the output of the mixer 15 and is supplied through an amplifier 16, a bandpass filter 17 and a second amplifier 18 to a first input of a third combining circuit, in this embodiment a phase detector 20. It will of course be understood by those skilled in the art that the combining circuits 12, 15 and 20 could be any of a variety of well known circuits such as mixers, multipliers, phase detectors, etc.

While any of a variety of different operating frequencies could be utilized in the above described receiver, specific frequencies will be described to more clearly explain the operation thereof. The frequency of the receive signal, $f_r$, at the input terminal 10 is equal to $221f_1 + f_n$. A second input to the mixer 12 supplies a signal at a frequency of $210f_1$ and the difference frequency signal, $11f_1 + f_n$ is selected by the amplifier 13 and filter 14. A second input to the mixer 15 supplies a signal at a frequency $10f_1 + f_n$ and the difference frequency signal, $f_1$, is selected by the amplifier 16, filter 17 and amplifier 18. A second input to the phase detector 20 supplies a signal at a frequency $f_1$ so that the signal at the output of the phase detector 20 is indicative of the error between the signal supplied to the first input thereof and the signal supplied to the second input thereof. This error signal is converted to a digital frequency control word in a suppressed carrier processor 22. The suppressed carrier processor 22 can be any convenient circuit, such as a sampling and A/D converter which is capable of converting the error signal into a control word.

The digital frequency control word from the processor 22 is connected to a receiver numerically controlled oscillator 25 and a transmitter numerically controlled oscillator 27. The numerically controlled oscillators 25 and 27 may be, for example, the type disclosed in U.S. patent application entitled "Improved Numerically Controlled Oscillator", Ser. No. 392,852, filed June 24, 1982, and assigned to the same assignee. A temperature stable crystal oscillator 30 supplies output signals at a frequency $2f_1$. The output signal of the oscillator 30 is supplied to a divide-by-two divider 32 the output of which, at a frequency $f_1$, is supplied to the second input of the phase detector 20. The output of the divider 32 is also connected to a divide-by-four divider 33, the output of which is connected to the numerically controlled oscillator 25 as a clock signal. The numerically controlled oscillator 25 supplies a sine and a cosine output at a frequency $f_n$, the output frequency being directly proportional to the frequency control word and the clock frequency supplied thereto. Either or both of the output signals from the numerically controlled oscillator 25 are supplied to a fourth receiver combining circuit, which in this embodiment is a single sideband modulator 35. A second input of the modulator 35 is adapted to receive a signal at a frequency $10f_1$ and the output of the modulator 35, which is connected to the second input of the mixer 15, is at a frequency equal to the sum of the two input signals, $10f_1 + f_n$. In this embodiment the single sideband modulation is accomplished at a relatively low frequency to achieve improvements in spurious. A single sideband modulator is utilized as the combining circuit because of the advantages in mixing and because expensive and complicated filters are not required. As is well known in the art, the single sideband modulator can be utilized to add or subtract the signal supplied thereto.

The crystal oscillator 30 also supplies an output signal at the frequency $2f_1$ to circuitry for producing a clock signal for the numerically controlled oscillator 27 in the transmitter of the transponder. The output of the crystal oscillator 30 is divided by 221 in a divider 37 and the output thereof is connected to one input of a combining circuit, which may be for example phase detector 38. The output of the phase detector 38 is coupled through a loop filter 40 to the control input of a voltage controlled oscillator 41. The output of the voltage controlled oscillator 41 is connected to a divider 42 which divides the frequency of the signal by 240 and supplies the divided signal to a second input of the phase detector 38. Thus, the voltage controlled oscillator 41 is connected into a phase-locked loop and is controlled to operate at the frequency 240/221 times the frequency of the signal supplied by the crystal oscillator 30. A divider circuit 45, which divides the output signal of the voltage controlled oscillator 41 by some fixed value, e.g. 8, supplies a clock signal to the numerically controlled oscillator 27 which is at a frequency $240/221f_c$. Clearly the divider 45 could be positioned between the crystal oscillator and the divider 37 or incorporated into the divider 37. Many other variations on the clock signal producing circuitry might be devised by those skilled in the art and it should be understood that the circuitry illustrated is simply for purposes of example.

The numerically controlled oscillator 27 supplies sine and cosine signals at the output thereof which are at a frequency $240/221f_n$. These signals are supplied to inputs of a single sideband modulator 47, which modulator 47 has a second input connected to receive a signal at a frequency $30f_1$. As explained previously, the modulator 47 can add or subtract the two input signals and in the present embodiment the sum of the two signals is supplied at the output thereof which is at the frequency $30f_1 + 240/221f_n$. The output signal from the single sideband modulator 47 is supplied to a QPSK modulator 48 which may be utilized to modulate messages onto the carrier if desired. If the transponder is simply utilized for determining the relative position of the satellite such messages may not be utilized and the modulator 48 can be eliminated. The modulated output signal from the modulator 48 is supplied to one input of a combining circuit, which in this embodiment is a mixer 50. A second input of the mixer 50 is connected to receive a signal at a frequency $210f_1$ and the output of the mixer which is at the transmission frequency $240f_1 + 240/221f_n$ is supplied through a bandpass filter 51 and amplifier 52 to the antenna system (not shown).

The output of the crystal oscillator 30 is also supplied to one input of a phase detector 55. The output of the phase detector is connected through a loop filter 56 to the control input of an S band voltage controlled oscillator 60. The output of the voltage controlled oscillator 60, which is at a frequency $210f_1$ is supplied to the second input of the mixer 12 in the receiver, a second input of the mixer 50 in the transmitter and to a divider 61 which divides the frequency of the signal by seven to produce an output at a frequency $30f_1$. The output of the divider 61 is supplied to the second input of the single sideband modulator 47 in the transmitter and to a divider 62 which is designed to divide the frequency by three to produce an output at a frequency of $10f_1$. The output of the divider 62 is connected to the second input of the single sideband modulator 35 in the receiver and to a divider 63 which divides the frequency by five so that a signal at a frequency of $2f_1$ is supplied to a second input of the phase detector 55. Thus, the phase-locked loop including phase detector 55, filter 56, oscillator 60 and dividers 61, 62 and 63 operates as the oscillator for the transmitter, the output of which is combined with the controlled frequency of the single sideband modulator 47 and numerically controlled oscillator 27 to provide an output signal at the transmission frequency. The output of the phase-locked loop is also used as a first local oscillator in the receiver and, since all of the variables are controlled by the same fixed frequency source, crystal oscillator 30, coherence in the transponder is maintained.

Figure 3:
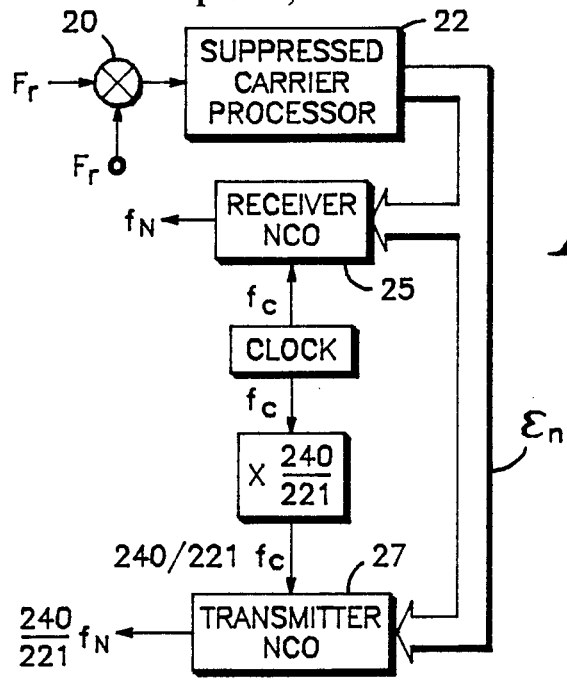
FIG. 3 is a simplified block diagram of portions of the transponder of FIG. 2.

FIG. 3 is a simplified block diagram of the transponder illustrated in FIG. 2, wherein similar components are designated with similar numbers. The purpose of FIG. 3 is to illustrate in a simplified form the apparatus whereby two numerically controlled oscillators control the receiver and transmitter at different frequencies while maintaining coherence. In this simplified block it is apparent that the different frequencies are obtained by altering the clock frequency supplied to the transmitter numerically controlled oscillator 27 while supplying the same digital frequency control word to both of the numerically controlled oscillators 25 and 27. Since the output frequency of the oscillators 25 and 27 is directly proportional to the frequency of the clock supplied thereto and the digital frequency control word, it is clear that this embodiment will provide the required frequencies with the advantages of digital control while maintaining the system coherent.

Because numerically controlled oscillators produce relatively low frequencies, the outputs must be converted to RF in some fashion. In attempting to convert the numerically controlled oscillator outputs to higher frequencies, filtering problems become the dominant limitation. The use of a single sideband modulator to convert the numerically controlled oscillator output frequency to rf is the most appealing since it provides a means for direct combining of fixed and variable frequency components. While the use of the numerically controlled oscillator and the single sideband modulator provide a relatively good output, referring to spectral purity, compared to local oscillator chain elements such as step recovery diode multipliers, etc., discrete spurs are still present. Thus, methods for improving carrier and sideband feedthrough can result in significant reduction of these spurs. One such scheme for cleaning-up the single sideband modulator output is shown in FIG. 4.

Figure 4:
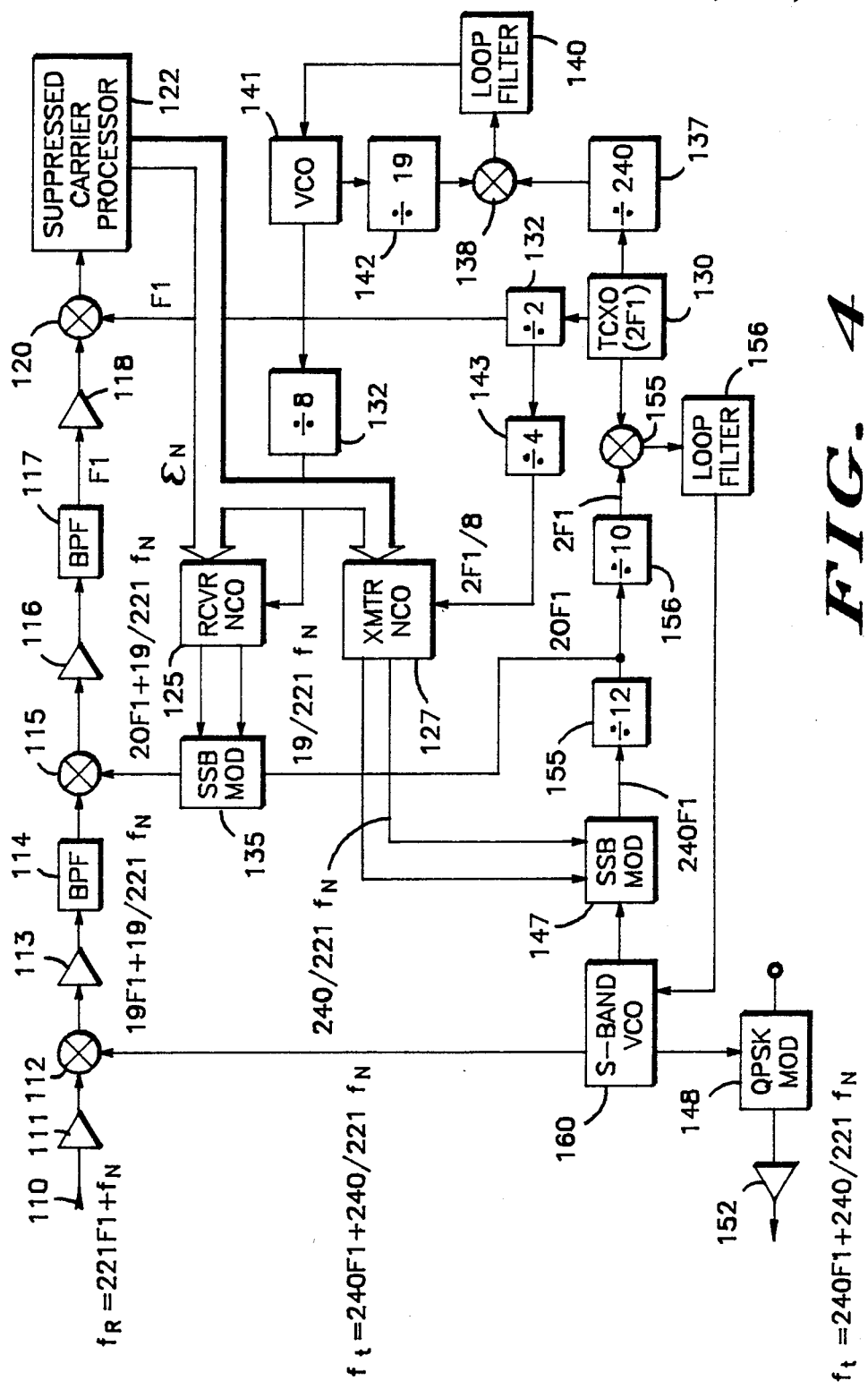
FIG. 4 is a block diagram of a second embodiment of a coherent transponder incorporating the present invention.

Referring specifically to the transponder embodiment illustrated in FIG. 4, the receiver is basically the same as that described in conjunction with the embodiment of FIG. 2. An input terminal 110 connected to an antenna system (not shown) supplies a received signal through an amplifier 111 to a first input of a mixer 112, the output of which is supplied through an amplifier 113 and bandpass filter 114 to the first input of a second mixer 115. The output of the second mixer 115 is supplied through an amplifier 116, a band pass filter 117 and an amplifier 118 to the first input of a mixer or phase detector 120. The output of the phase detector 120 is supplied to a digital suppressed carrier processor 122 which produces a digital frequency control word at the output thereof that is supplied to a receiver numerically controlled oscillator 125 and a transmitter numerically controlled oscillator 127. The transponder of FIG. 4 differs from the transponder of FIG. 2 in the internal operating frequencies and in the specific manner of generating certain of the frequencies. In the receiver, the frequency of the received signal is the same, $221f_1+f_n$, but the local oscillator signal applied to the first mixer 112 is at a frequency $240f_1+240/221f_n$, which results in the difference frequency $19f_1+19/221f_n$ at the output. The receiver numerically controlled oscillator 125 supplies a variable component at a frequency $19/221f_n$ to a single sideband modulator 135 which also receives a signal at the frequency of $20f_1$ from the phase-locked loop. The single sideband modulator 135 supplies the combined output signal at a frequency $20f_1+19/221f_n$ to the second mixer 115 so that the output thereof is at a frequency $f_1$. A temperature stable crystal controlled oscillator 130 supplies an output signal at a frequency $2f_1$ through a divide-by-two divider 132 to a second input of the phase detector 120. Thus, some of the operating frequencies, such as the operating frequency between the first mixer 112 and the second mixer 115 differ from the operating frequencies of the receiver in FIG. 2 but the controlled operating frequency from the second mixer 115 through the rest of the receiver remains the same.

The crystal oscillator 130 supplies a reference frequency signal to a divider circuit 137 which divides the reference signal by 240 and supplies it to a first input of a phase detector 138. The output of the phase detector 138 is supplied through a loop filter 140 to the control input of a voltage controlled oscillator 141. The output of the oscillator 141 is supplied through a divider circuit 142 which divides the frequency by 19 and supplies it to a second input of the phase detector 138. The output of the voltage controlled oscillator 141 is also supplied through a divide-by-8 divider 146, which supplies a clock signal at the frequency $2f_1/8 \cdot 19/240$ to the receiver numerically controlled oscillator 125. The reference frequency output signal from the crystal oscillator 130, divided by 2 in the divider 132, is supplied to a divide-by-4 divider circuit 143, the output of which is the clock signal input to the transmitter numerically controlled oscillator 127. The output signal from the divide-by-4 divider 143 is at a frequency $2f_1/8$. This signal is supplied to the transmitter numerically controlled oscillator 127 so that the output signal therefrom, supplied to a single sideband modulator 147, is at a frequency $240/221f_n$. Similarly the clock signal supplied to the receiver numerically controlled oscillator 125, which is at a frequency $2f_1 8 \cdot 19/240$, produces an output signal at a frequency $19/221f_n$.

The output of the crystal oscillator 130 is also supplied to one input of a phase detector 155, the output of which is supplied through a loop filter 156 to the control input of an S band voltage controlled oscillator 160. The output of the voltage controlled oscillator 160, which is at a frequency $240f_1+240/221f_n$, is supplied to a second input of the first mixer 112 in the receiver as the first local oscillator. The output of the VCO 160 is also supplied to a second input of the single sideband modulator 147 and through a QPSK modulator 148 to a power amplifier 152 which conveys the signal to the transmission system for transmission. Since the voltage controlled oscillator 160 can produce a sizeable power level, only the power amplifier 152 is required in the transmitter. The modulator 148 is utilized to modulate any information desired on to the transmission signal, as described in conjunction with FIG. 2. The phase locked loop is completed by connecting the output of the modulator 147 through a divide-by-twelve divider 155 and a divide-by-ten divider 156 to a second input of the phase detector 155. The single sideband modulator 147 is connected to subtract the output signal of the numerically controlled oscillator 127 from the output signal of the voltage controlled oscillator 160. The output signal of the single sideband modulator 147 is at a frequency $240f_1$. After this signal passes through the divide-by-twelve divider 155 the frequency is $20f_1$, which signal is supplied to the single sideband modulator 135. This signal is also supplied through the divide-by-ten divider 156 to provide a signal at the frequency $2f_1$ for application to the phase detector 155. Thus, in this embodiment the single sideband modulator output is improved somewhat by inserting the modulator in the phase-locked loop between the voltage controlled oscillator and the divider chain. If the frequency of the numerically controlled oscillator 125 is offset such that $f_n$ is much greater than the bandwidth of the phase-locked loop then the spurious carrier and unwanted sidebands will not be tracked by the loop and their appearance on the output of the voltage controlled oscillator 160 will be reduced by the attenuation of the loop filter 156. This approach does introduce some delay in the RF frequency versus control word response. With typical synthesizer loop bandwidth on the order of five-to-twenty kHz this delay should not significantly affect receiver tracking loops which typically have bandwidths of a few hundred Hertz.

Figure 5:
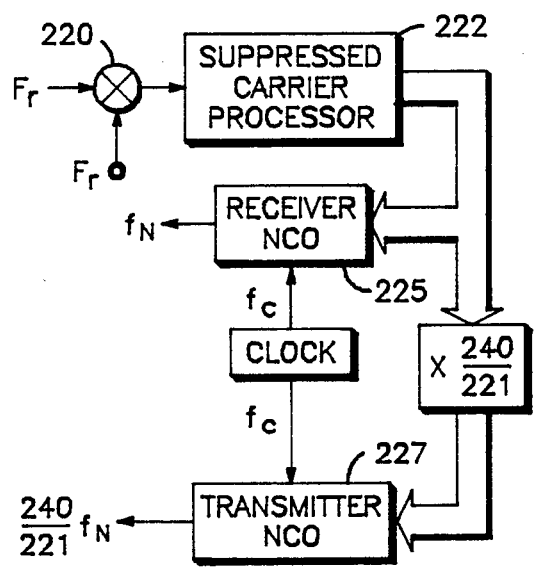
FIG. 5 is simplified block diagram of a portion of a third embodiment of a coherent transponder incorporating the present invention.

Referring specifically to FIG. 5, a simplified block diagram somewhat similar to that illustrated in FIG. 3 is disclosed. However, in this embodiment the digital frequency control word from the suppressed carrier processor 222 is supplied directly to the receiver numerically controlled oscillator 225 but is divided by 240/221 before being applied to the transmitter numerically controlled oscillator 227. Further, in this embodiment the clock signals, at a frequency $f_c$, are supplied directly to both of the numerically controlled oscillators 225 and 227. Thus, the difference in output frequencies from the numerically controlled oscillators is achieved by dividing the digital frequency control word rather than the clock frequency.

Thus, several embodiments of coherent transponders, each including a transmitter and a receiver operating at different frequencies have been disclosed. In each instance the frequencies of the transmitter and receiver are controlled by numerically controlled oscillators which are in turn controlled by digital frequency control words to greatly simplify the overall transponder and reduce the cost and power required. As disclosed in the above described copending application, the numerically controlled oscillators can be constructed on an IC chip and in many instances some of the division can be accomplished digitally, which can be extremely simple. Further, the frequencies of the numerically controlled oscillators are raised to the required levels by utilizing a phase-locked loop in conjunction with single sideband modulators. Because the numerically controlled oscillators and the phase-locked loop are all referenced to a single fixed frequency source the entire transponder is maintained coherent.

While I have shown and described several specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. A coherent transponder for a communications system, including a transmitter and a receiver operating at different frequencies, comprising:
  a first numerically controlled oscillator coupled to the receiver for controlling the operating frequency in at least a portion thereof;
  a second numerically controlled oscillator coupled to the transmitter for controlling the operating frequency in at least a portion thereof;
  a fixed frequency source;
  a means for comparing the controlled operating frequency of the receiver to a predetermined frequency derived from said fixed frequency source and providing a digital frequency control word representative of any error in the controlled operating frequency;
  means coupling clock signals from said fixed frequency source and the frequency control word to said first and second numerically controlled oscillators for controlling said first and second numerically controlled oscillators to provide the different operating frequencies in the transmitter and receiver while maintaining coherence.

2. A coherent transponder as claimed in claim 1 wherein the first numerically controlled oscillator is coupled to the receiver through a single-side-band modulator and the second numerically controlled oscillator is coupled to the transmitter through a second single-side band modulator.

3. A coherent transponder as claimed in claim 2 wherein each of the single-sideband modulators receives a fixed frequency signal from a phase-locked loop in which the fixed frequency source supplies a reference frequency.

4. A coherent transponder as claimed in claim 3 wherein the receiver further includes a first mixer having received signals coupled thereto and local oscillator signals coupled thereto from the phase-locked loop.

5. A coherent transponder as claimed in claim 3 wherein the transmitter further includes a final mixer having a local oscillator signal coupled thereto from the phase-locked loop.

6. A coherent transponder as claimed in claim 3 wherein an input and an output of the second single-sideband modulator are coupled into the phase-locked loop and the phase-locked loop operate as a transmitter oscillator.

7. A coherent transponder as claimed in claim 1 wherein the fixed frequency source includes a temperature stable crystal oscillator.

8. A coherent transponder for a communications system comprising:
  a receiver including first, second, third and fourth combining circuits and a numerically controlled oscillator;
  a transmitter transmitting signals different in frequency and coherent with signals received by said receiver and including a phase-locked loop, a combining circuit and a numerically controlled oscillator;
  a fixed frequency source coupled to supply signals to said receiver and transmitter numerically controlled oscillators and to said phase-locked loop;
  a digital processor coupled to receive an output signal from the receiver third combining circuit and convert the output signal to a digital frequency control word which is coupled to each of the receiver and transmitter numerically controlled oscillators;
  said receiver first combining circuit having a first input coupled to a receiver input, a second input coupled to an output of said transmitter phase-locked loop and an output,
  said receiver fourth combining circuit having a first input coupled to an output of said receiver numerically controlled oscillator, a second input coupled to an output of said transmitter phase-locked loop and an output coupled to a first input of said receiver second combining circuit, said output of said receiver first combining circuit being coupled to a second input of said receiver second combinig circuit, an output of said receiver second combining circuit being coupled to a first input of said receiver third combining circuit and a second input of said receiver third combing circuit being coupled to said fixed frequency source; and said transmitter numerically controlled oscillator being coupled to a first input of said transmitter combining circuit, a second input of said transmitter combining circuit being coupled to said phase-locked loop and the phase-locked loop operating as an oscillator of the transmitter.

9. A coherent transponder as claimed in claim 8 wherein the fourth combining circuit of the receiver and the combining circuit of the transmitter each comprising a single-sideband modulator.

* * * * *